United States Patent [19]

Owens et al.

[11] Patent Number: 5,314,346
[45] Date of Patent: May 24, 1994

[54] FLEXIBLE CIRCUIT APPLIQUE PATCH CUSTOMIZATION FOR GENERIC PROGRAMMABLE CABLE ASSEMBLIES

[75] Inventors: Gene R. Owens, Oronoco; Robert J. Reis, Winona, both of Minn.; Richard G. Shomo, Rhinebeck, N.Y.; Scott D. Wickus, Rochester, Minn.

[73] Assignee: International Business Machines Corporation, Armonk, N.Y.

[21] Appl. No.: 993,472

[22] Filed: Dec. 18, 1992

[51] Int. Cl.$^5$ ............................................. H01R 29/00
[52] U.S. Cl. ..................................................... 439/189
[58] Field of Search ..................................... 439/48–52, 439/189, 74, 75, 67, 77, 492, 493, 499, 507; 361/398, 412, 413

[56] References Cited

U.S. PATENT DOCUMENTS

| | | | |
|---|---|---|---|
| 3,382,475 | 5/1968 | Kramer | 339/18 |
| 3,509,268 | 4/1970 | Schwartz et al. | 439/49 |
| 3,701,964 | 10/1972 | Cronin | 361/412 |
| 4,180,304 | 12/1979 | Lerude | 339/196 |
| 4,418,239 | 11/1983 | Larson et al. | 174/34 |
| 4,490,775 | 12/1984 | Quan | 361/426 |
| 4,579,407 | 1/1986 | Shimada | 339/29 R |
| 4,607,170 | 8/1986 | Wickman | 307/147 |
| 4,742,431 | 5/1988 | Igarashi | 361/398 |
| 4,950,169 | 8/1990 | Martin et al. | 439/44 |

OTHER PUBLICATIONS

Microcomputing, Overview by F. J. Derfler, Jr., pp. 19, 20, Feb. 1984.
IBM Tech. Discl. Bull., S. Picard, Printed Circuit Card Rework Process, vol. 15, No. 1, Jun. 1972, pp. 246-247.
Reworking of Component Bearing Cards, IBM Tech. Discl. Bull., vol. 20, No. 4, pp. 1532-1533, Sep. 1977.
Circuit Overlay Adapter Assembly for Circuit Changes W. D. Saucier, IBM Tech. Discl. Bull., vol. 18, No. 7, pp. 2050-2051, Dec. 1975.

*Primary Examiner*—Neil Abrams
*Attorney, Agent, or Firm*—Laurence R. Letson

[57] ABSTRACT

A customized cable for the interconnection of electronic devices or electronic interfaces is accomplished by the application of an applique patch containing custom desired circuits for interconnecting the interrupted connectors in the cable itself. The applique patch may be inserted into the connector housing through an aperture in the connector housing thereby allowing customization or rework of the cable, if necessary, to correct a defect or to make repairs. The applique patch then is connected to provide electrical connections between the conductors of the cables and the connector and to reroute the signals to a different signal assignment arrangement at the connector.

11 Claims, 4 Drawing Sheets

FLEXIBLE CIRCUIT APPLIQUE PATCH CUSTOMIZATION FOR GENERIC PROGRAMMABLE CABLE ASSEMBLIES

FIELD OF THE INVENTION

This invention relates to the fabrication and customization of electronic cabling for electrical equipment and, more particularly, to cabling used in the electronic data processing environment.

BACKGROUND OF THE INVENTION

Flat ribbon cables have been used extensively when it is necessary to interconnect different types of electronic machines, such as computers and peripheral equipment, or to cable connect internal portions of machines such as in computers. Although advantageous in many respects, flat ribbon cables, present a particular signal assignment or conductor assignment pattern at their ends. The signal assignment or conductor assignment, being the designation of particular conductors for particular signals in a typically left to right pattern across the end of the flat ribbon cable, is not always the same for all pieces of equipment or all interfaces that are being interconnected.

When the signal assignment pattern varies from connection to connection, and hence from one end of the cable to the other in order to be compatible with both pieces of equipment or both interfaces being interconnected, it is necessary to reroute the conductors at some point between the ends of the cables.

It is particularly difficult to accomplish this with flat ribbon cables inasmuch as it takes a reasonably high degree of skill to separate adjacent conductors without damaging them and, at the same time to reroute one or more of the conductors to a different position relative to the other conductors of the cable. With ribbon cables typically having a center to center distance between adjacent conductors of 0.050 inches or less, and the connectors to which the cables are terminated having similar adjacent spacing between contacts, the customized connection and soldering of rerouted conductors becomes a very labor intensive operation.

Efforts have been made in the past to overcome this problem and are probably best represented by U.S. Pat. No. 4,418,239 to Larson, et. al. The Larson, et. al. patent discloses a technique for rerouting conductors to shift at least one conductor and, more particularly the signal on that conductor, to a different relative position at some point between the ends of the cable.

The Larson, et. al. technique involves applying an insulative patch over the conductors on the cable substrate and then depositing an electrically conductive path between the termination points of conductors on the cable substrate and on top of the insulating patch to connect the segments of the conductors on the cable substrate. Where it is necessary for the deposited electrically conductive path on the insulating patch to cross over another electrically conductive path, multiple insulating patches are laid down to separate the conductive paths, preventing shorting. The Larson, et. al. technique requires the ability not only to position accurately a conductive patch having holes at appropriate locations, but also to deposit and to cure silk screenable electrically conductive paste to form the conductive paths and equipment necessary to cure or to dry the silk screenable paste. While this technique does in fact rearrange the signal pattern from one end of the cable to the other end of the cable, it does not permit the easy customization of a cable as required at a particular installation site or as required on the assembly line.

Other solutions to this type of problem have included the inclusion of a circuit and an integrated circuit timer to control the reassignment of signals between the ends of a cable. Such is illustrated in U.S. Pat. No. 4,607,170 to Wickman, and the use of a bank of switches and switching gear such as illustrated in U.S. Pat. No. 4,579,407 to Shimada.

Both of these solutions are not only expensive, but require substantial additional equipment be interconnected into or included within the cable run.

Without the ability to reassign the signal pattern on the conductors at the end of the cables easily and economically, a large number of different and unique cables must be stocked to accommodate all of the desired combinations of signal assignment that may be necessary for the manufacture, repair or maintenance, and interconnection of different electronic devices.

SUMMARY OF THE INVENTION

Accordingly, it is an object of this invention to simplify the customizing of cables and thereby to reduce inventory costs and space required for maintaining cables for use in electrical interconnection.

It is a further object of the invention to establish a high quality reliable contact at the applique interface to insure that signals are not unduly degraded due to the rerouting of the signal paths.

These objects and others may be accomplished with a generic cable that has a connector on at least one end that is attached to the cable without regard to the signal assignments desired from one end of the cable to the other.

The connector, which is attached to and forms a part of the cable assembly, incorporates a printed circuit which includes conductors extending from the contacts of the connector itself to termination pads on the printed circuit. A second set of termination pads are provided spaced from the printed circuit pads which are connected to the contacts of the connector and may be used as termination pads for the individual conductors of the cable. The cable, typically a flat ribbon cable, may have the ends of its conductors prepared and electrically connected and then attached to the termination pads provided therefore. The printed circuit of the connector may be enclosed within a connector housing which will be formed or molded around the connector, forming a plug; the plug adds stability and strength to the printed circuit portion of the connector.

An applique patch then is fabricated using conventional techniques to produce a multi-level flexible circuit with termination pads on one surface positioned and disposed for surface-to-surface contact with the termination pads on the printed circuit of the connector. Selected ones of the termination pads on the applique patch are interconnected during the fabrication of the patch to provide continuity paths between the selected termination pads. As the termination pads of the applique patch are positioned over and in contact with the respective termination pads on the printed circuit of the connector, continuity between one conductor and a second conductor may be established. To reliably establish the conductivity between the first and second termination pads and respective conductors, the termination pads on the applique patch may be pre-coated with a solder paste and the solder reflowed using any of several conventional solder reflow techniques to permanently bond the applique patch and its termination pads to the termination pads on the printed circuit.

A more detailed understanding of the invention may be had from the drawings and the detailed specification, to follow.

DRAWINGS

DETAILED DESCRIPTION OF THE DRAWINGS OF THE INVENTION

Figure 1:
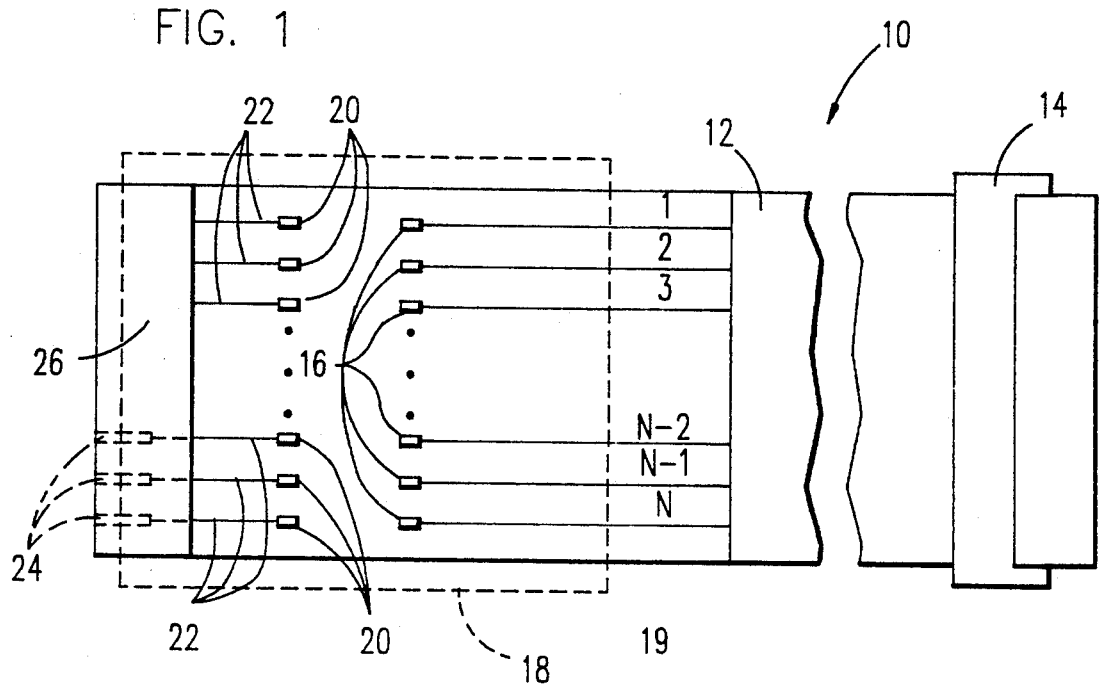
FIG. 1 illustrates a first connector, the printed circuit, cable, and a second connector of the cable assembly.

Referring now to FIG. 1, the generic cable assembly 10 is illustrated. The generic cable assembly 10 is comprised of a cable 12 which typically is a flat ribbon cable. The flat ribbon cable 12 may be discrete wires 1, 2, . . . N-1, N encased in an insulation, with the wires lying parallel to each other. Alternatively, the cable may be copper bands laid onto a substrate and excess material copper etched away to leave the conductors and then encased by another insulative layer. The substrate may also serve to support the connector pads 16, 20 and conductors 22 jointing with the connector contact elements 24.

Additionally on one end of the cable 12 is a connector 14 of conventional type attached to and forming the termination of the cable 12. The signal assignment or conductor assignment at this connector 14, dictated by the signal output assignment pattern of the device to which this connector will be attached, is the datum from which the signal assignments are modified.

For ease in describing signal assignments, the conductors in FIG. 1 have been assigned designations 1, 2, 3 . . . N-2, N-1 and N. The conductors of the cable 12 are then either stripped or prepared at their ends, to be attached to termination pads 16. Termination pads 16 are disposed on the face of a printed circuit 18. Printed circuit 18 further has termination pads 20 formed on the same surface as termination pads 16 and interconnected by conductors 22 to the mating contacts 24 in the connector housing 26. The contacts 24 and connector 26 of connector housing 27 may be of any conventional design suitable for the uses of the cable designer.

In most cases, the design of the connector 26 and the contacts 24 will be dictated by the type of connector (not shown) on the unit to which the cable 10 will be attached.

Figure 2:
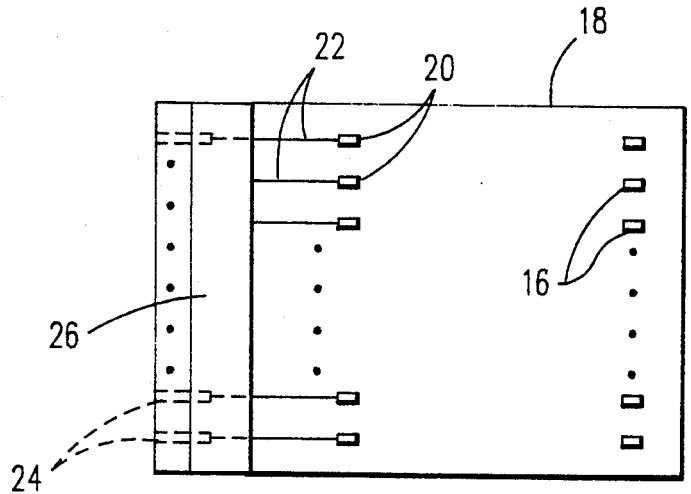
FIG. 2 is a detailed drawing of the printed circuit of the customizing connector.

Referring now to FIG. 2, the interconnection between the printed circuit 18 and the connector housing 26 and contacts 24 is conventional and thus will depend upon the type of connector 26 selected. However, the fabrication of the printed circuit 18 requires that the substrate, typically a polyester terethalate, have deposited thereon a conductive layer. The conductive layer is then etched away using acids or other etchants to leave the conductive pattern or conductors 22 and the contact pads 20 and 16 in desired positions. This process can be conducted with extreme accuracy and thereby permits very close tolerance positioning of the termination pads 16 and 20.

If desired, the termination pads 16 and 20 then may be coated, using conventional coating techniques, with a solder or solder paste to insure their solderability in a later fabrication step. Contact pads 16 with the precoating of solder, make the contact pads 16, particularly susceptible for attachment to the individual conductors of the cable 12. The contact pads 16 may be coated with a material for protection against corrosion. By reducing corrosion, the solderability of the pads 16 is promoted. A suitable coating for corrosion protection is Entek, obtainable from ENTHONE-OMI, Inc. of West Haven, Connecticut.

Figure 3:
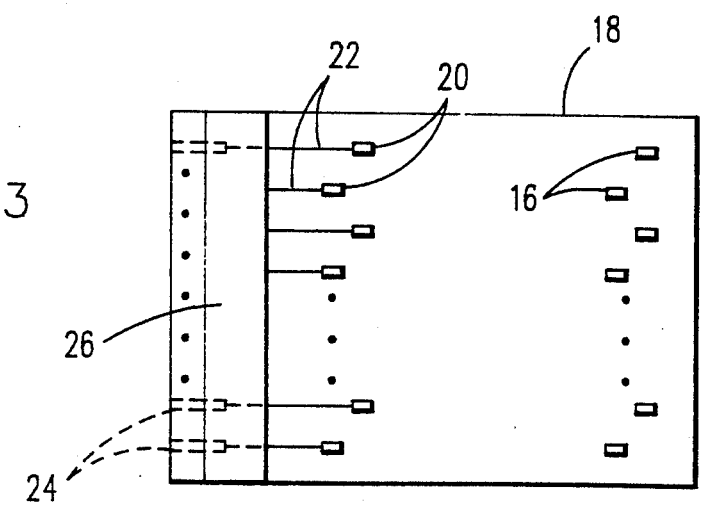
FIG. 3 illustrates alternative printed circuit layout for use in the customizing connector.

The patterns of the termination pads 16, 20 are not critical as long as they are controlled and accurately positioned. The patterns may be a linear pattern, such as illustrated in FIG. 2, or may alternatively be a staggered pattern, such as illustrated in FIG. 3. The illustration of these two patterns is not intended to limit the patterns that may be available inasmuch as the precise pattern is not a critical part of the invention.

Figure 4:
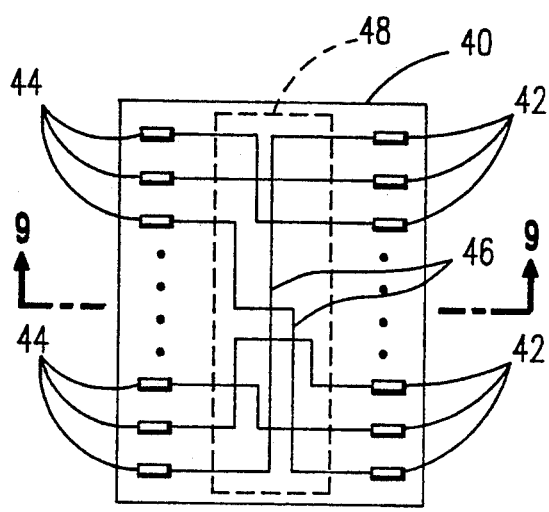
FIG. 4 illustrates the applique patch showing the circuit layout for an exemplary circuit that rearranges the signals on the cable conductors.
Figure 9:
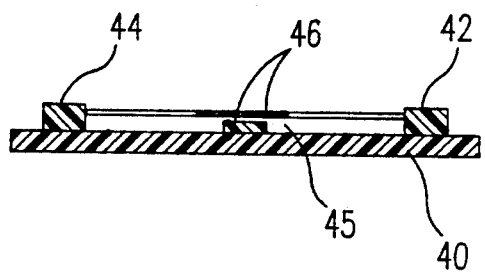
FIG. 9 is a section view of the applique patch of FIG. 4 along section line 9—9.
Figure 5:
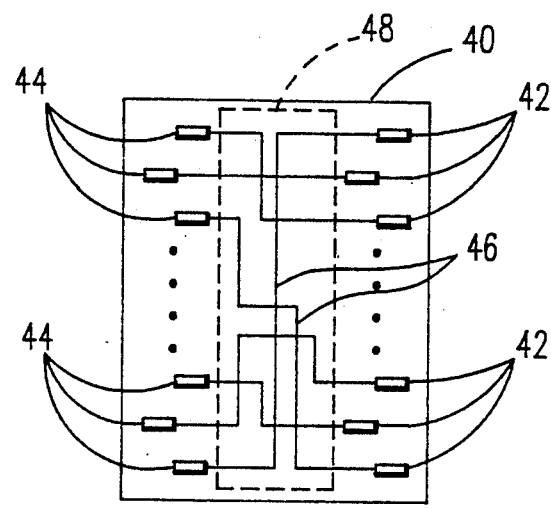
FIG. 5 illustrates the patch showing the circuit layout but for an alternative printed circuit layout.
Figure 6:
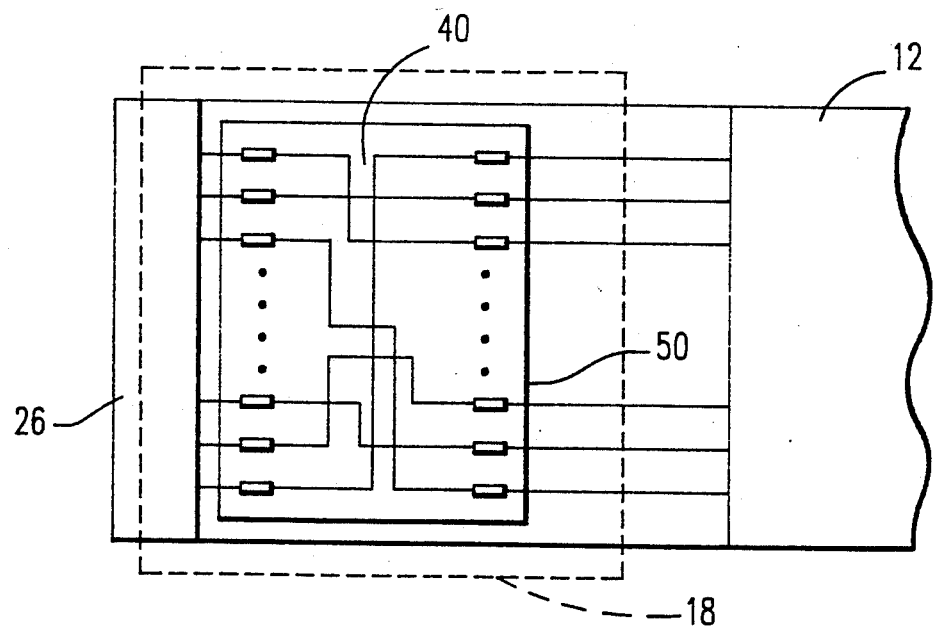
FIG. 6 illustrates the customizing connector housing and particularly an opening in the connector housing which permit the insertion and application of the applique patch to customize the cable assembly after the connector housing has been formed and molded onto the generic cable assembly.

The flexible circuit applique patch 40 is illustrated in FIGS. 4 and 5. The differences between FIG. 4 and 5 are the arrangements of the termination pad pattern reflecting the pad pattern of FIG. 2 and FIG. 3. Patch 40 is typically a multi-layered circuit fabricated on a flexible insulating substrate by the deposition of a conductive layer such as copper and then the masking with a suitable etch resist coating exposure to a light pattern, and etching of the copper to produce a part of the pattern required for the interconnection of the termination pads 42, 44. The conductors which remain on the substrate then are overcoated with an insulative layer and additional layers of conductive material and masking material are deposited; each layer of masking material is exposed to a pattern and washed, whereby the mask remaining protects the conductive layer to produce additional conductive paths. Some or all of the paths may be in contact with the conductive paths formed earlier in this process. The sequence of steps will be repeated as necessary to create the necessary number of layers and the required interconnecting paths 46 extending from termination pads 42 and 44.

Once all the termination pads 42 are connected to termination pads 44 as desired, the termination pads 42, 44 may be precoated with a solder to prepare them for attachment to the termination pads 16, 20, of printed circuit 18. The contact pads 42 may be likewise coated for corrosion resistance.

If desired, a protective insulating layer then may be deposited over the topmost electrical conductors 46 to protect the conductors 46 from the atmosphere and other deleterious oxidizing agents which may affect the reliability of the conductors 46 on the patch 40. The above fabrication process lends itself to production of large numbers of patches 40 and also to large numbers of variations of circuit patterns, when necessary.

Additionally, if desired for ease in assembly, region 48 then may be coated with an adhesive 48. The application of the adhesive 48 is particularly advantageous since it is very useful in holding the applique patch 40 in position in its face-to-face relationship with the printed circuit 18 until such time as the termination pads 16, 20, and the termination pads 42, 44 may be solder reflowed to form permanent electrical attachment between the respective termination pads.

Figure 7:
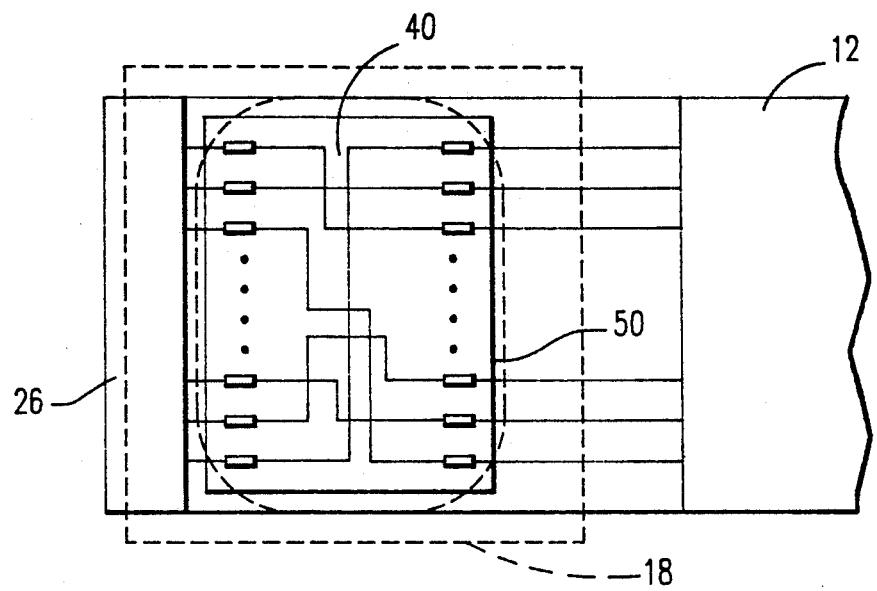
FIG. 7 illustrates the connector housing of the generic cable with the customizing applique patch in place.
Figure 8:
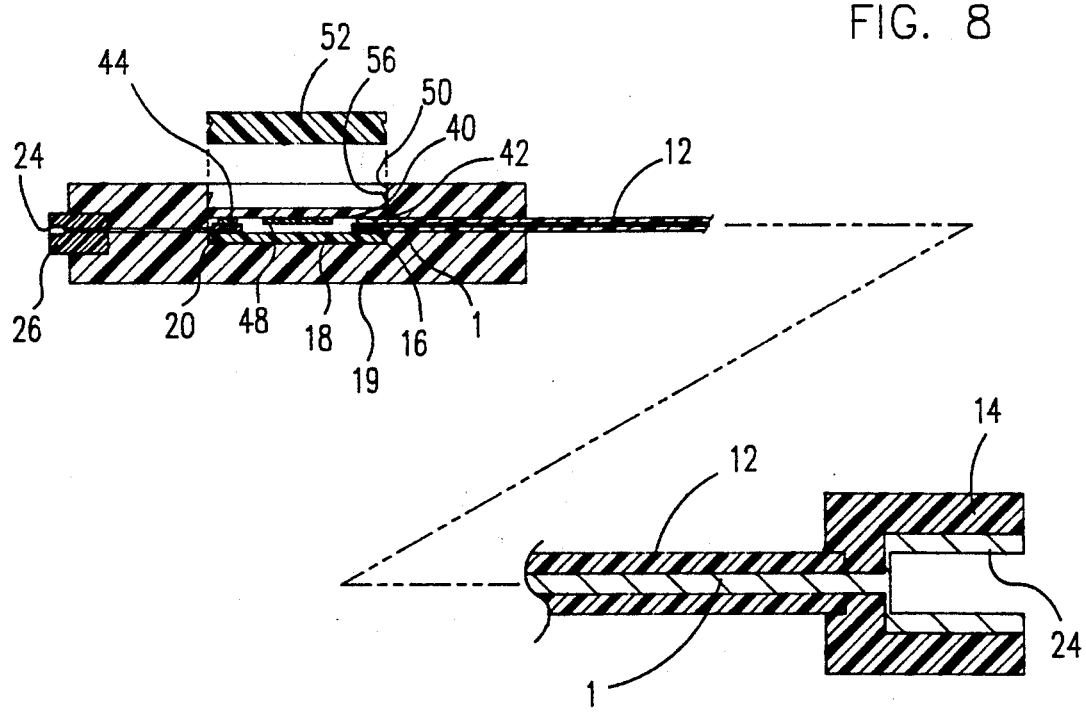
FIG. 8 is a side view of the connector housing illustrating the plug which may be inserted into the opening of the connector housing to close access to the applique patch and rework area, while at the same time completing the connector housing assembly.

FIGS. 7 and 8 and are now referred to for illustration of one embodiment of the connector 19 where access is provided to the termination pads 16, 20 on the printed circuit 18 for purposes of customization or rework. The opening 50 illustrated in the connector 19 housing permits the insertion of an applique patch 40 into the housing 26 and alignment with the termination pads 16, 20 of the printed circuit 18. After the applique 40 has been properly positioned, heat may be applied to cause the solder to reflow between the pads 42, 44 on the applique patch 40 and pads 16, 20 on the printed circuit 18.

Depending upon the shape of the opening 50 into the connector housing 19, such as shown in FIG. 7, it may be necessary to slightly trim the applique patch 40 to make it fit into the opening 50.

Figure 10:
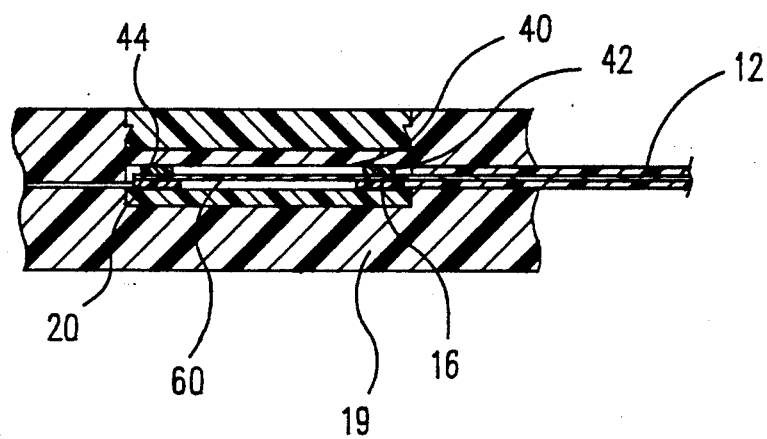
FIG. 10 is a side view of a portion of the connector assembly and applique patch of FIG. 8 incorporating an anisotropic elastomeric connector.

The reflow of the solder to join the termination pads 42, 44 and termination pads 16, 20 may be accomplished by many different approaches; however, an infrared heating arrangement may prove to be the most advantageous during rework which requires the heat be directed down into the connector housing 19. Other attachment techniques include vapor phase reflow, laser soldering, welding, laser or sonic welding, conductive adhesives and anisotropic elastomeric connector such as anisotropic elastomeric connector 60 in FIG. 10.

Anisotropic elastomeric connectors are resilient sheets which conduct only in the Z direction and do no conduct in the X and Y directions. An example of such an anisotropic elastomeric conductor is Elastomeric Conductive Polymer Interconnect available from AT&T Microelectronics of Allentown, Pennsylvania.

The use of a soldering iron or soldering gun is equally applicable to this construction. Should it be desirable to use a solder gun or soldering element and to supply additional solder to the joint over and above that already precoated onto the pads 16, 20, 42, 44, small via holes may be provided through the applique patch 40 and through the termination pads 42, 44, such that when additional molten solder is deposited on the backside of the applique patch 40, it will be attracted through the via hole to the interface between the termination pads 16, 20 on the applique patch 40 and the termination pads 42, 44 on the printed circuit 18.

To observe a side sectional view of the connector housing 26 and associated elements, reference is made to FIG. 8, wherein cable 12 extends between connector 14 and the connector housing 19. The connector housing 19 encloses the connector 26 and printed circuit 18. The region of printed circuit 18 which has termination pads 16 and 20 thereon remains exposed through an opening 50 which then permits the insertion of the applique patch 40 and positioning of the termination pads 42, 44 over the termination pads 16, 20. With the positioning of the applique patch 40, adhesive 48 may be engaged with the top surface of the printed circuit 18 to retain the applique patch 40 in its desired position.

After the termination pads 16, 42 and 20, 44 respectively are bonded by solder reflow, the closure 52 may be inserted into opening 50 and may be retained by the retention grooves 54 and engagement with retention ridge 56 on the interior of opening 50.

Closure 52 may be removed from the connector housing 19 to permit access to the applique patch 40 at a later time if necessary to repair or rework the cable assembly 12.

Significant advantages that flow from this invention are the ability to customize cables as needed, on site, by selecting an appropriate applique patch and attaching it to the interrupted connectors 1, 2, . . . N of the cable assembly 10. The ability to perform this customizing operation at or near final assembly or in the field where the using equipment is installed precludes the need for large inventories of cables having different signal assignments, but rather only a few applique patches 40 of varying conducting patterns required and a very few generic cable assemblies.

It becomes very apparent that the costs of inventory and control together with the manufacturing costs of the cable apparatus may be reduced significantly by utilization of this invention.

Minor changes and modifications to this invention may be made by one desiring to implement this invention in a particular environment, without departing from the scope of the invention as defined by the claims below.

We claim:

1. A customized programmable cable assembly comprising:
   a first connector comprising a first plurality of mating contacts for contacting and mating with contacts on a connected device;
   said first connector further comprising a printed circuit, said printed circuit further comprising a first plurality of conductors extending from and in electrical contact with said mating contacts, a first plurality of termination pads electrically connected to said conductors, and a plurality of second termination pads;
   an electrical cable comprising a second plurality of conductors, each of said second plurality of conductors disposed in electrical contact with one of said plurality of second termination pads;
   said first termination pads disposed spaced from said second termination pads;
   an applique comprising a flexible multi-layer circuit having exposed termination pads disposed in an array corresponding to placement of said first termination pad and said second termination pads, at least one of said applique termination pads electrically interconnected with another of said applique termination pads;
   said applique juxtaposed to said first termination pads and said second termination pads with corresponding ones of said applique termination pads and said contacting termination pads joined to form an electrical connection there between, whereby a cable having a designated conductor assignment at one end may be customized to present different conductor assignment at another end thereof.

2. The cable of claim 1 further comprising a second connector comprising a second plurality of mating contacts and said cable conductors electrically connected to said second plurality of mating contacts.

3. The cable of claim 1 further comprising a plug housing enclosing said first plurality of mating contacts, said printed circuit and a portion of said second plurality of conductors and said applique.

4. The cable of claim 3 wherein said housing comprises an access opening disposed over said applique.

5. The cable of claim 4 further comprising a removable closure disposed in said access opening.

6. The cable of claim 4 wherein said removable closure and said housing comprises retaining means to retain said closure in said access opening.

7. The cable of claim 1 wherein said contact pads on said applique and said first and second contact pads are joined by solder.

8. The cable of claim 1 wherein said applique comprises at least a region of adhesive disposed on a surface which also supports said applique contact pads.

9. The cable of claim 1 wherein said contact pads on said applique and said first plurality of pads are joined by a weld.

10. The cable of claim 1 wherein said contact pads on said applique and said first and second plurality of contact pads are jointed by a conductive adhesive.

11. The cable of claim 1 wherein said contact pads on said applique and said first and said second plurality of contact pads are electrically connected with an anisotropic elastomeric connector.

* * * * *